Nov. 16, 1965 R. M. SHANNON ETAL 3,218,571

ELECTRONIC SERVO CONTROLLED AUTOMATIC FREQUENCY SCANNING SYSTEM

Filed July 24, 1963 3 Sheets-Sheet 1

INVENTORS.
RAYMOND M. SHANNON
DEAN A. STRIEF
BY Alden D. Redfield
Irwin P. Garfinkle
ATTORNEYS.

INVENTORS.
RAYMOND M. SHANNON
DEAN A. STRIEF
BY Alden D. Redfield
Irwin P. Garfinkle
ATTORNEYS.

INVENTORS.
RAYMOND M. SHANNON
DEAN A. STRIEF
BY Alden D. Redfield
Irwin P. Garfinkle
ATTORNEYS.

3,218,571

ELECTRONIC SERVO CONTROLLED AUTOMATIC FREQUENCY SCANNING SYSTEM

Raymond M. Shannon and Dean A. Strief, Cincinnati, Ohio, assignors to Avco Corporation, Cincinnati, Ohio, a corporation of Delaware Filed July 24, 1963, Ser. No. 297,374
10 Claims. (Cl. 331—4)

This invention relates to automatic tuning systems generally, and more particularly to an electronically tuned variable frequency oscillator which is stepped between a large number of channels in a frequency band. To accomplish positive stepping, the system provides for servo controlled sequential gating of the channel-seeking functions to prevent early stall before reaching the selected channel and also to prevent channel overshoot.

The invention finds utility and was reduced to practice in the frequency synthesizer of a single sideband communications system. The synthesizer shown in Brauer application Serial No. 142,208, filed October 2, 1961, and in Lamplot application Serial No. 106,750, filed May 1, 1961, is typical of the type of synthesizer in which this invention is useful. This synthesizer references the frequencies of individual channels to a system clock, and the desired channel is frequency locked to the clock when tuning is accomplished. Tuning to another channel requires unlocking from the former channel and a reset to the new channel. Tuning is accomplished electronically by varying the voltage on a voltage-sensitive capacitance in the tuning circuits of a variable frequency oscillator.

In systems described in the Brauer and Lamplot applications, the variable frequency oscillator developed intermediate frequency is applied to a frequency discriminator which produces a direct voltage as a function of displacement from a given frequency. The direct voltage output of the discriminator is used to drive the variable frequency oscillator toward the selected channel frequency. The variable frequency oscillator developed intermediate frequency is also applied to a phase detector, where it is compared with a clock-controlled reference intermediate frequency. If there is an error in frequency, the alternating current output voltage which is developed is also used to drive the variable frequency oscillator; however, there is not sufficient gain in the frequency locked loop for this voltage to affect the variable frequency oscillator until the frequency error is small—i.e., within the so-called "capture range" of the detector. The frequency discriminator does not always provide sufficient drive to position the variable frequency oscillator within this "capture range." The present invention was conceived for the purpose of solving this problem and provides a satisfactory and practical means for positive signal capture and frequency lock-in of the desired channel in tuning operations.

A broad object of this invention is to provide improved oscillator control, assuring lock-in at a selected frequency.

Another object of this invention is to provide sequential drives for precisely tuning a variable frequency oscillator to a selected channel, thereby avoiding overshoot, hunting, and locking at adjacent channels.

Still another object of this invention is to electronically tune a variable frequency oscillator to a selected channel by means of a servo drive including a frequency discriminator having a direct voltage output proportional to frequency displacement from a reference for driving the tuning networks of said oscillator toward the frequency of the selected channel, a triangular wave hunt generator, operable after a time delay for further driving said tuning networks, and a phase detector for locking said tuning network at the selected frequency and for disabling said hunt generator.

For further objects and for a clearer understanding of the precise nature of this invention, reference should now be made to the accompanying drawings, in which:

FIGURE 2 is a schematic diagram of the triangular wave hunt generator with its associated control circuitry;

Figure 4:
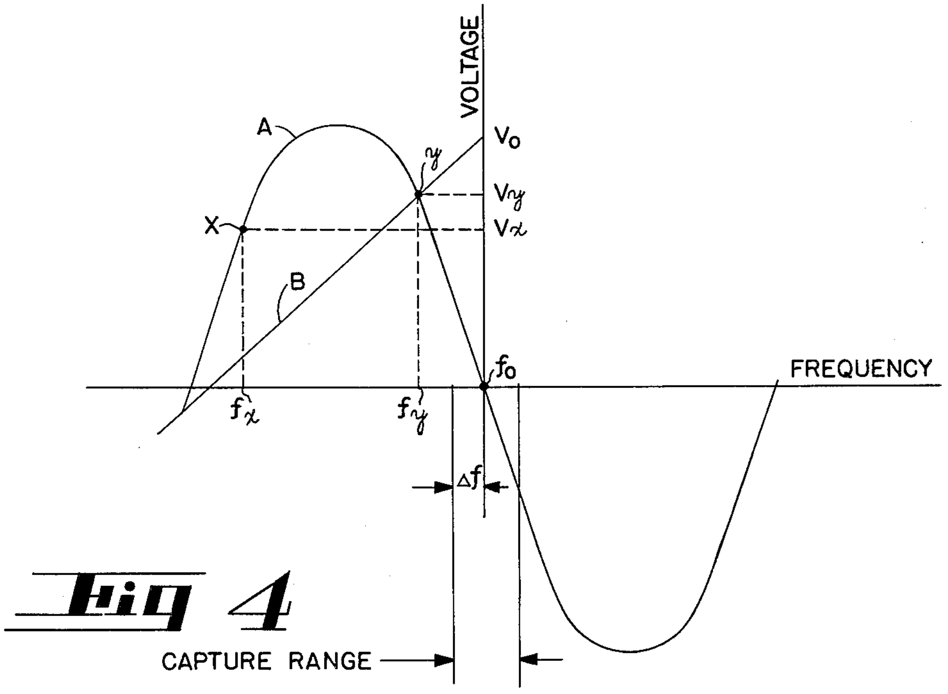
Figure 5:
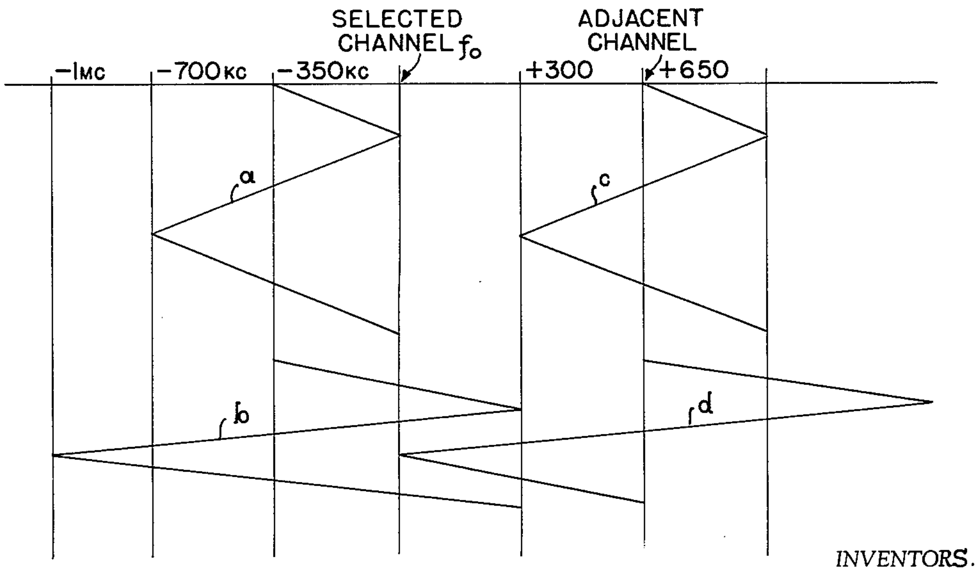

FIGURE 4 comprises a curve showing the frequency response of the discriminator and the sensitivity curve of the variable frequency oscillator; and FIGURE 5 comprises a series of curves demonstrating the hunt generator operation.

Figure 1:
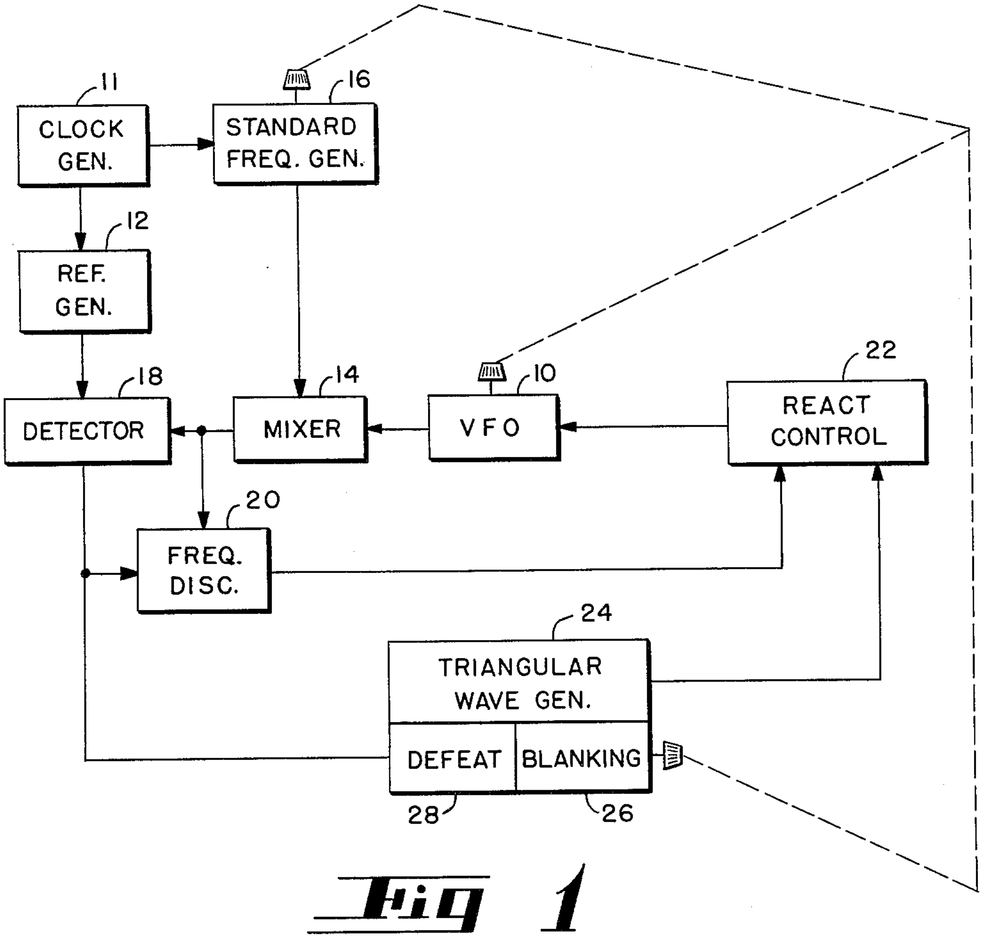
FIGURE 1 is a block diagram of the invention.

The invention, as illustrated in the block diagram of FIGURE 1, comprises a variable frequency oscillator 10, the frequency of which is to be controlled within precise limits. For this purpose the system includes a clock generator 11 which functions as the frequency standard for the entire system. The clock generator may be of any conventional type, but the generator described and claimed in the copending application of Salomon Polaniecki, Serial No. 114,127, filed June 1, 1961, and assigned to the same assignee as this invention, was used in the system as reduced to practice. The output of the clock generator 11 controls the frequency of operation of a reference generator 12, which in turn produces a fixed reference intermediate frequency at its output. The fixed intermediate frequency output of generator 12 is then applied to one input of a phase detector 18. The output from the variable frequency oscillator 10 is applied to a mixer 14, where it is heterodyned with the output from a standard frequency generator 16. The beat frequency output from the mixer 14 is applied to the other input of the phase detector 18.

The standard freqeuncy generator 16 is also controlled in frequency by the clock generator 11, and it is precisely settable to any selected frequency in its operating spectrum. The variable frequency oscillator 10 and the standard frequency generator 16 are ganged so as to simultaneously control the frequency of operation of the frequency generator 16 and the tuning of the oscillator 10 to to maintain a constant beat or difference frequency from the mixer 14 for every operating frequency of the oscillator 10.

Thus, both the reference intermediate frequency and the mixer output are applied to the phase detector 18. When the oscillator 10 is correctly tuned, the output from mixer 14 is also at the reference intermediate frequency. If not correctly tuned, there is a frequency difference that is detectable by the phase detector 18.

The output from the mixer 14 is also applied to a frequency discriminator 20. The outputs from both the detector 18 and the frequency discriminator 20 are applied to a reactance control device 22 which serves to control the frequency of operation of the variable frequency oscillator 10. Preferably, the reactance control device 22 is a voltage-sensitive capacitor, the capacity of which varies with applied voltage. Such devices are illustrated in the copending Ira T. Pope patent application, Serial No. 104,-713, filed April 21, 1961, and assigned to the same assignee as this invention.

Figure 3:
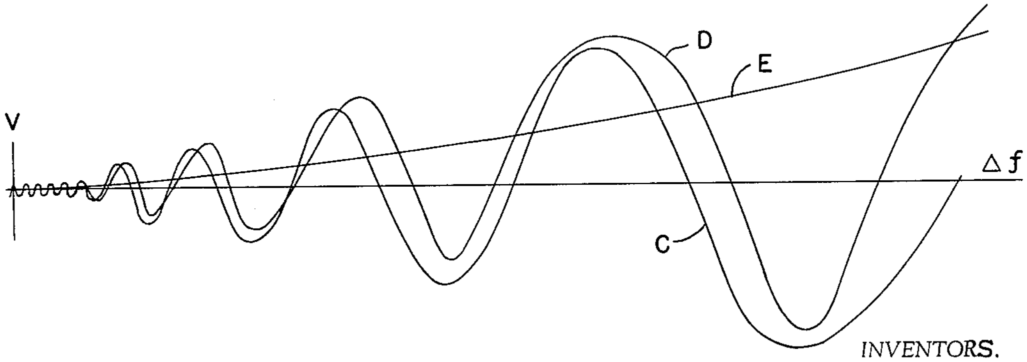
FIGURE 3 is a curve illustrating the response of the phase detector.
Figure 7:
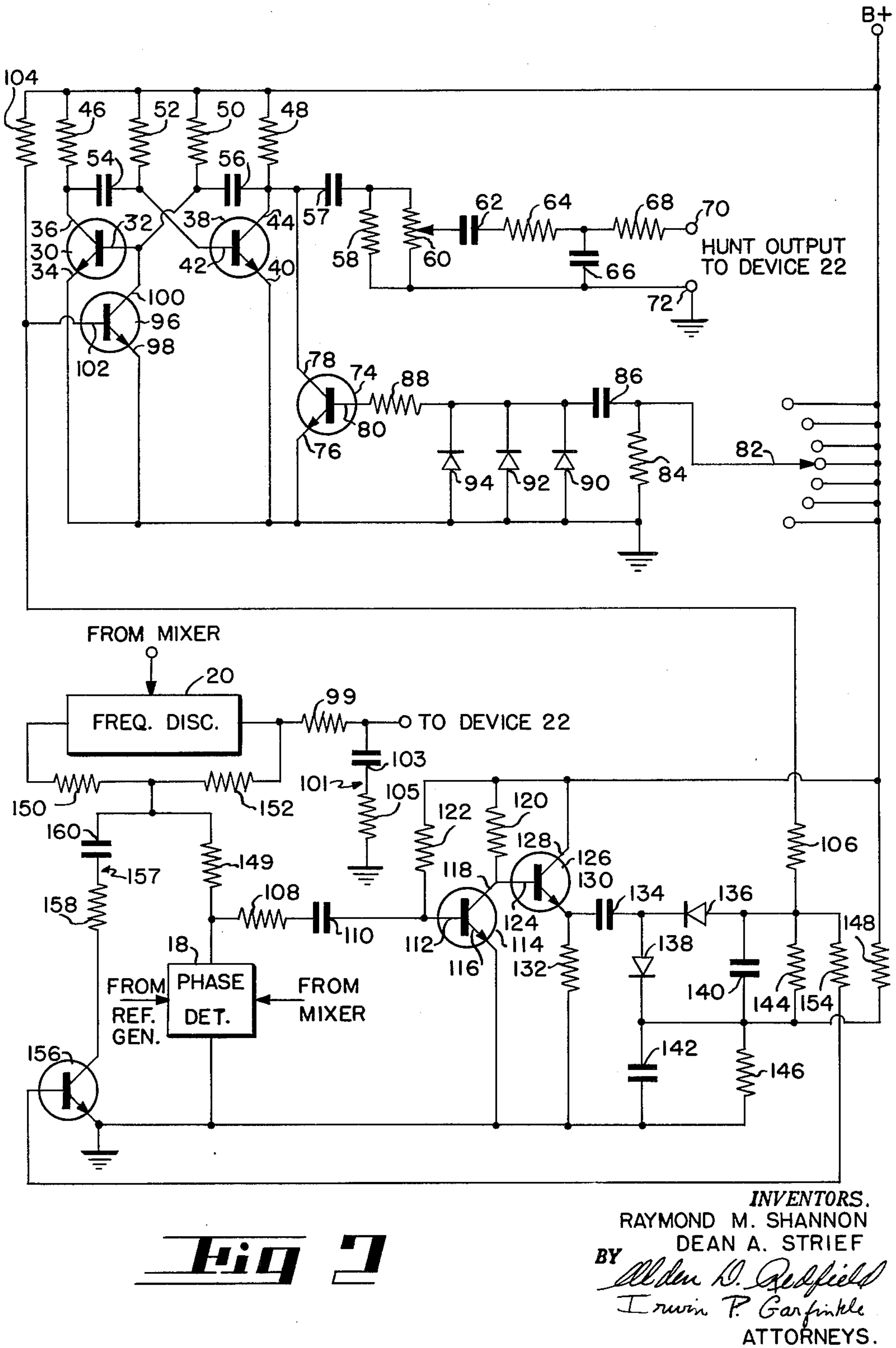

The phase detector 18 is of the type described by Raymond Midkiff in U.S. Patent 2,945,950, assigned to the same assignee as this invention. The characteristics of the detector are such that when its output is integrated and connected in a servo loop, as illustrated, a difference in frequency between the reference intermediate frequency from the generator 12 and the beat frequency output from mixer 14 results in a direct voltage having a magnitude which varies in inverse relation to the frequency difference, so that the servo loop has low gain except at low frequency differences. The characteristics of the detector in the servo loop are illustrated in FIGURE 3. The curve C represents the response of the detector when disconnected from the servo loop. The curve D shows the response of the detector when connected in the loop, but without an integration. Curve E is the integrated direct voltage output of the detector which is used to drive the reactance device 22. It will be understood that this system locks the variable frequency oscillator in frequency, but there will be a phase displacement, dependent on the valve of the voltage on curve E at which frequency lock occurs.

FIGURE 4 illustrates the characteristic curve A of the frequency discriminator 20 in conjunction with the sensitivity curve B of the variable frequency oscillator 10. As in conventional discriminators, the output from the frequency discriminator 20 is a direct voltage having a magnitude and polarity which vary in a sinusoidal manner as a function of displacement from the center frequency. The sensitivity curve B of the variable frequency oscillator is such that for a given voltage applied to the reactance control device 22, the oscillator 10 will produce a given frequency. During the period when changing from one frequency of operation to another, the output from the mixer 14 may be displaced in frequency from the reference intermediate frequency $f_0$. This displacement is an error which will produce an output voltage from the frequency discriminator 20 at some point along the curve A—for example, point $x$—to generate a voltage $V_x$ at frequency $f_x$. When applied to the reactance control device 22, the voltage $V_x$ will drive the reactance device 22 and oscillator 10 along the curve A towards $f_0$. However, when the curve A and the curve B intersect, the system tends to stop at point $y$, at voltage $V_y$ and frequency $f_y$.

As previously noted, the gain of the servo loop is low except when the frequency difference between the reference intermediate frequency and the beat frequency output from the mixer 14 is small. The largest frequency difference capable of driving the device 22 is indicated as $\pm\Delta f$, the "capture range" of the detector. In the example of FIGURE 4, the curves A and B cross at a frequency $f_y$ which is outside the capture range. The system includes a triangular wave generator 24, which is automatically controlled, to drive the reactance control device 22 into the capture range of the detector 18, and thereafter to be turned off by the detector.

The generator 24 includes a blanking circuit 26 and a defeat circuit 28. When changing frequencies, the blanking circuit 26 serves to disable the triangular wave generator for a given period of time to enable the frequency discriminator 20 to first drive the oscillator 10 to frequency $f_y$ before a triangular wave is generated. The defeat circuit, which is energized by the detector 18, serves to disable the triangular wave generator 24 when the detector 18 takes control of the servo loop. Thus, after the frequency discriminator 20 has driven the reactance control device 22 to the point $f_y$ (where the variable frequency oscillator sensitivity curve A and the frequency discriminator characteristic curve B intersect) the triangular wave generator output drives the reactance control device 22 and the oscillator 10 into capture range of the detector 18, where the detector takes over to lock in at $f_0$. At this point generator 24 is automatically turned off by the detector through the defeat circuit 28, and only the output of the phase detector 18 serves to maintain the reactance control device at the proper frequency setting.

The circuitry for performing the various functions of the block diagram of FIGURE 1 is shown in FIGURE 2. The triangular wave generator 24 comprises a free-running multivibrator consisting of an NPN transistor 30 having a base 32, a grounded emitter 34, and a collector 36, and an NPN transistor 38 having a grounded emitter 40, a base 42, and a collector 44. The collectors 36 and 44 are connected to a B+ supply through resistors 46 and 48, respectively, while the bases 32 and 42 are biased by means of connections to the B+ supply through resistors 50 and 52, respectively. The collector 36 of transistor 30 is connected to the base 42 of transistor 38 through a capacitor 54, while the collector 44 of transistor 38 is connected to the base 32 of transistor 30 through a capacitor 56. When oscillating, a square wave output is derived from the collector 44 of transistor 38 and applied to an integrator comprised of the capacitor 57, resistor 58 and potentiometer 60 in parallel, capacitor 62, resistor 64, capacitor 66, and resistor 68. A triangular wave output is derived from between the terminals 70 and 72, from where it is applied to the reactance control device 22.

It will be recalled that when switching from one frequency to another, the multivibrator is disabled by means of a blanking circuit 26. This circuit comprises transistor 74 having a grounded emitter 76, a collector 78 connected to the B+ supply through resistor 48, and a base 80. The biasing circuit for the base 80 includes a connection from the B+ supply to the base 80 through a selector switch 82, a capacitor 86, and resistor 88. A resistor 84 is connected from one side of the capacitor 86 to ground, while three parallel-connected diodes 90, 92, and 94 are connected from the other side of capacitor 86 to ground. After the selector switch has been in a given operative position for a short length of time, the capacitor 86 is charged to the full voltage of the B+ supply and there is no voltage on the base 80. Therefore, the transistor 74 is cut off and does not affect multivibrator operation. When the selector switch 82 is moved from one position to another, there is a short period when the supply is disconnected from the capacitor 86. During this short period, capacitor 86 discharges very rapidly through the resistor 84 and the diodes 90, 92, and 94. When the switch makes contact with the next position, the full voltage is again applied to the capacitor 86, which now charges through a circuit including resistor 88 and the base-emitter junction. This application of charging currents to the base 80 causes a large current to flow through the transistor 74 and through the resistor 48 in the collector circuit of the transistor 38. This current flow essentially connects the collector 44 of transistor 38 to ground and prevents multivibrator operation. After a period of time, determined by the time constants of resistor 88 and capacitor 86, the collector current of transistor 74 falls exponentially to a low enough value for the multivibrator to again start oscillating. During the period when the generator 24 is blanked, the frequency error produces a direct voltage output from the discriminator 20 which is applied through resistor 99 and across filter 101, comprising a capacitor 103 and a resistor 105, to the reactance control device 22 to drive the oscillator 10 to the point "y" where the curves A and B intersect. However, this point "y" is outside the capture range of the phase detector 18. After transistor 38 stops conducting, the triangular wave generator 24 serves to drive the oscillator 10 into the detector capture range. Thereafter the generator 24 is turned off by the defeat circuit 28.

The circuit for performing the function of the defeat circuit 28 includes the transistor 96 having a grounded emitter 98, a collector 100 connected to the base 32 of transistor 30, and a base 102 connected to the junction of base-biasing resistors 104 and 106. The base-bias resistor 104 is connected to the B+ supply, while the base-biasing resistor 106 is connected to the output from a network which serves to develop a negative voltage when the variable frequency oscillator 10 is not operating at the correct frequency and which serves to provide a positive output voltage when at the correct frequency. With the B+ supply connected to the base 102 through resistor 104 and a positive voltage applied through the resistor 106 (this condition occurs when at the proper frequency), the transistor 96 conducts heavily, thereby connecting the base 32 of transistor 30 to ground and preventing multivibrator operation. On the other hand, when not at the correct operating frequency, a negative voltage is developed and applied to the base 102 through resistor 106 and the transistor 96 is cut off to permit multivibrator operation.

To develop the negative voltage for application to the base 102, the output from the phase detector 18 is applied through an alternating current coupling circuit, including a resistor 108 and a capacitor 110, to the base 112 of a transistor 114. The emitter 116 of transistor 114 is connected to ground, while its collector 118 is connected to the B+ supply through a resistor 120. Base bias is provided by means of a resistor 122. The output from the transistor 114 is derived from the collector 118 and applied directly to the base 124 of a transistor 126 having a collector 128 connected to the B+ supply and an emitter 130 connected to ground through an emitter load resistor 132.

When the variable frequency oscillator 10 is not operating at the correct frequency, there is a frequency difference between the inputs to the detector 18 from mixer 14 and generator 12. The resulting beat frequency output voltage from the detector 18 is amplified by the transistors 114 and 126. The emitter-follower output from transistor 126 is then applied through a capacitor 134 to a voltage-doubling rectifier including the diodes 136 and 138, the capacitors 140 and 142, and the resistors 144 and 146. The junction of resistors 144 and 146 is connected to the B+ supply through a resistor 148. The negative direct voltage developed at the diode 136 is coupled through resistor 106 to the base 102 to bias the transistor 96 off and permit operation of the generator 24, thus developing a hunt output voltage for driving the reactance device 22. When the system is operating in the capture range of the detector, the detector output serves to supply the drive voltage through resistor 149 and resistors 150 and 152 in the discriminator 20.

When the outputs from the mixer 14 and reference generator 12 are driven to the same frequency, the output from the phase detector 18 is a direct voltage having a magnitude dependent on phase displacement. Since the coupling between the detector 18 and the transistor 114 is capacitive (through capacitor 110), the direct voltage output of detector 18 does not yield an output from the diode 136, and the generator 24 is again disabled. However, the direct voltage output of detector 18 maintains the correct frequency setting of the variable frequency oscillator 10. The output voltage developed at the diode 136 is also applied through a resistor 154 to the base of a transistor 156. When transistor 156 is conductive, it serves to connect a filter 157 comprised of a resistor 158 and a capacitor 160 across the output of phase detector 18. This circuit function forms no part of the present invention, but it is fully described and claimed in the aforementioned Lamplot patent application.

Thus, when changing from one frequency of operation to another, the following sequences of circuit operation result:

First, the triangular wave generator 24 is blanked because of the discharging and subsequent charging of capacitor 86 in the base input circuit of transistor 74 when the switch 82 is rotated. Previously, the generator 24 had been blanked by the conduction of transistor 96, due to the fact that a high voltage is on its base 102, and no voltage was developed at diode 136.

Second, while the generator 24 is blanked by transistor 74, the direct voltage output of the discriminator 20 is applied to the reactance control device 22 to control the variable frequency oscillator 10 and drive its frequency to $f_y$ at the intersection of curves A and B.

Third, the beat frequency difference ($f_y \pm f_o$) output from the detector develops a negative voltage at diode 136 to cut off transistor 96 and thus permit the starting of the generator 24.

Fourth, when the output of the variable frequency oscillator is within the capture range of the detector 18, the direct voltage output developed by detector 18 drives the reactance device 22 until the variable frequency oscillator is locked in frequency.

Fifth, at this point the lack of a beat frequency output from the detector 18 causes the transistor 96 to conduct and the generator 24 is disabled. Thereafter, the entire control for the reactance device 22 and the variable frequency oscillator 10 is by means of the detector 18.

The frequency discriminator 20 in conjunction with the triangular wave generator 24 limits, controls and transposes the frequency range over which the variable frequency oscillator 10 is driven. Without this control the variable frequency oscillator drives for adjacent channels would be as illustrated in FIGURE 5. Trace "*a*" illustrates a condition of minimum sensitivity on the desired channel $f_o$. Trace "*c*" represents the simultaneous drive on the adjacent channel. Increased gain in the order of 6 db, a fairly moderate range of gain variation for the system, results in traces "*b*" and "*d*" respectively. It will be seen that these traces extend into adjacent channels. Noting that in a practical system the output of the standard frequency generator 16 may also contain the harmonics for adjacent channels, the channel actually selected by the automatic device will be uncertain, and about equal possibilities of desired and adjacent channel selections exist under the illustrated conditions. This invention corrects that potential error condition since the output of the discriminator 20 serves to effectively limit the drive of the triangular wave hunt generator 24 so that it cannot drive onto an adjacent channel.

In an embodiment of this invention actually reduced to practice the following parameters were used and are reproduced here for the purpose of better enabling persons skilled in the art to use the invention. These circuit parameters are illustrative only and should not be construed as limitations on the scope of the invention.

| Resistors: | Ohms |
|---|---|
| **46** | 3.9K |
| **48** | 3.9K |
| **50** | 100K |
| **52** | 100K |
| **58** | 18K |
| **64** | 15K |
| **68** | 5.6K |
| **84** | 900 |
| **88** | 56K |
| **99** | 10K |
| **104** | 220K |
| **105** | 330 |
| **106** | 56K |
| **108** | 22K |
| **120** | 10K |
| **122** | 270K |
| **132** | 4.7K |
| **144** | 56K |
| **146** | 2.7K |
| **148** | 5.6K |
| **149** | 18K |
| **150** | 100K |
| **152** | 100K |
| **154** | 100K |
| **158** | 330 |

Transistors used are all Type 2N706.

| Capacitors: | μf. |
|---|---|
| **54** | 6.8 |
| **56** | 6.8 |
| **57** | 56 |
| **62** | 56 |
| **66** | 6.8 |
| **86** | 15 |
| **103** | 0.5 |
| **110** | 0.01 |
| **134** | 200 |
| **140** | 35 |
| **142** | 35 |
| **160** | 200 |

| Diodes: | Type |
|---|---|
| 90 | 1N645 |
| 92 | 1N645 |
| 94 | 1N645 |
| 136 | 1N770 |
| 138 | 1N770 |

| Potentiometer: | Ohms |
|---|---|
| 60 | 10K |

Many modifications and adaptations will at once become apparent to persons skilled in the art. It is intended, therefore, that this invention be limited only by the appended claims interpreted in the light of the prior art.

What is claimed is:

1. In an automatic frequency control system for maintaining the frequency of oscillation of a variable frequency source at a selected frequency, the combination comprising:
   - a reactance control device having characteristics such that its reactance varies with applied voltage, the reactive impedance of said device controlling the resonant frequency of said variable frequency source;
   - a frequency discriminator supplied with the output of said variable frequency source, said frequency discrimator developing a first voltage having a magnitude representing the deviation of the frequency of said variable frequency source from said selected frequency;
   - a hunt generator for developing a second voltage, said second voltage periodically increasing and decreasing in magnitude;
   - a source of reference frequency;
   - a phase detector supplied with the output of said variable frequency source and said source of reference frequency, said phase detector developing a third voltage representing the instantaneous deviation in phase of a voltage developed from said variable frequency source from said source of reference frequency, said third voltage being an alternating voltage when there is a difference in frequency between said voltages and being a direct voltage when the frequencies of said voltages are equal, and having a magnitude proportional to the phase displacement of said voltages;
   - means for applying said first, second, and third voltages sequentially to said device in the order named; and
   - means for disabling said hunt generator when said voltage developed from said variable frequency source and said reference voltage are at equal frequencies, said third voltage maintaining the resonant frequency of said variable frequency source at said selected frequency.

2. The invention as defined in claim 1 wherein the output from said frequency discriminator is a direct voltage, the polarity of which represents the direction of deviation of the frequency of said variable frequency source from said selected frequency.

3. The invention as defined in claim 1 wherein said second voltage is triangular in wave form.

4. The invention as defined in claim 3 wherein said hunt generator comprises: a free-running multivibrator having first and second transistors, each having base, emitter and collector electrodes, said emitter electrodes being interconnected and the base and collector electrodes being capacitively cross coupled, said electrodes being connected to a source of direct voltage for forwardly biasing said base and emitter electrodes and for reverse biasing said collector electrodes, whereby a square wave output is produced at said collectors; and
   - means for continuously integrating said square wave output to provide a triangular wave, said integrated square wave output being applied to said reactance control device.

5. The invention as defined in claim 4 wherein said means for disabling said hunt generator comprises a normally conducting third transistor having a base, emitter, and collector electrodes, said collector and emitter electrodes being connected across two of the electrodes of one of said first and second transistors, whereby said hunt generator is disabled when said third transistor is conducting;
   - an alternating current network coupled to said phase detector for deriving alternating current signals from the output of said phase detector;
   - means for rectifying said alternating current signals to provide a direct voltage biasing potential of a polarity tending to cut off said third transistor; and
   - means coupling said direct voltage biasing potential to the base of said third transistor, whereby said third transistor is cut off except when said deviation in frequency is zero.

6. The invention as defined in claim 5 and additional disabling means connected to said hunt generator and operative when changing operation from said selected frequency to another selected frequency for disabling said hunt generator for a predetermined period of time.

7. The invention as defined in claim 6 wherein said additional disabling means comprises a normally nonconductive fourth transistor having collector and emitter electrodes connected across two of the electrodes of one of said first and second transistors and having a base electrode connected to said source of direct current forward biasing potential through a capacitor;
   - and means when changing operation for disconnecting said source and discharging said capacitor, and for reconnecting said source, whereby said base is forward biased until said capacitor is recharged.

8. The invention as defined in claim 1 and additional means connected to said hunt generator and operative when changing operation from said selected frequency to another selected frequency for disabling said hunt generator for a predetermined period of time.

9. In an automatic frequency control system for maintaining the frequency of oscillation of a variable frequency oscillator locked at a selected frequency to a reference frequency, the combination comprising:
   - a reactance control device having characteristics such that its reactance varies with applied voltage, the reactive impedance of said device controlling the resonant frequency of said variable frequency oscillator;
   - means for developing a first intermediate frequency from the output of said variable frequency oscillator;
   - a reference generator for generating a second intermediate frequency, said second intermediate frequency constituting said reference frequency;
   - a frequency discriminator supplied with said first intermediate frequency, said frequency discriminator developing a first voltage having a magnitude representing the deviation in frequency between said first and second intermediate frequencies;
   - a hunt generator for developing a second voltage, said second voltage periodically increasing and decreasing in magnitude;
   - a phase detector supplied with said first and second intermediate frequencies, said phase detector developing a third voltage representing the instantaneous deviation in phase of said first and second intermediate frequencies, said third voltage being an alternating voltage when there is a difference in frequency between said first and second intermediate frequencies and being a direct voltage when said first and second intermediate frequencies are equal and having a magnitude proportional to the phase displacement of said intermediate frequencies;
   - means for applying said first, second, and third voltages sequentially to said device in the order named; and
   - means for disabling said hunt generator when said deviation in frequency is zero, said third voltage maintaining the resonant frequency of said variable frequency oscillator at said selected frequency.

10. The invention as defined in claim 9 wherein the output from said frequency discriminator is a direct voltage, the polarity of which represents the direction of deviation of said second intermediate frequency from said first intermediate frequency;

and wherein said hunt generator comprises a free-running multivibrator having first and second transistors, each having base, emitter and collector electrodes, said emitter electrodes being interconnected and the base and collector electrodes being capacitively cross coupled, said electrodes being connected to said source of direct voltage for forwardly biasing said base and emitter electrodes and for reverse biasing said collector electrodes, whereby a square wave output is produced at said collectors;

means for continuously integrating said square wave output to provide a triangular wave, said integrated square wave output being applied to said reactance control device;

and wherein said means for disabling said hunt generator comprises a normally conducting third transistor having a base, emitter, and collector electrodes, said collector and emitter electrodes being connected across two of the electrodes of one of said first and second transistors, whereby said hunt generator is disabled when said third transistor is conducting;

an alternating current network coupled to said phase detector for deriving alternating current signals from the output of said phase detector;

means for rectifying said alternating current signals to provide a direct voltage biasing potential of a polarity tending to cut off said third transistor;

and means coupling said direct voltage biasing potential to the base of said third transistor, whereby said third transistor is cut off except when said deviation in frequency is zero;

additional disabling means connected to said hunt generator and operative when changing operation from said selected frequency to another selected frequency for disabling said hunt generator for a predetermined period of time, said additional disabling means comprising a normally non-conductive fourth transistor having collector and emitter electrodes connected across two of the electrodes of one of said first and second transistors and having a base electrode connected to a source of direct current forward biasing potential through a capacitor;

and means when changing operation for disconnecting said source and discharging said capacitor, and for reconnecting said source, whereby said base is forward biased until said capacitor is recharged.

References Cited by the Examiner

UNITED STATES PATENTS

| | | | |
|---|---|---|---|
| 2,287,925 | 6/1942 | White | 331—4 X |
| 2,434,294 | 1/1948 | Ginzton | 331—4 |
| 2,581,594 | 1/1952 | MacSorley | 331—11 X |
| 2,595,608 | 5/1952 | Robinson et al. | 331—13 X |
| 2,881,319 | 4/1959 | Sills | 331—4 |
| 2,909,675 | 10/1959 | Edson | 307—88.5 |
| 2,956,239 | 10/1960 | Hugenholtz et al. | 331—11 X |

ROY LAKE, *Primary Examiner.*

JOHN KOMINSKI, *Examiner.*